United States Patent

Huang et al.

[11] Patent Number: 6,057,189
[45] Date of Patent: May 2, 2000

[54] METHOD OF FABRICATING CAPACITOR UTILIZING AN ION IMPLANTATION METHOD

[75] Inventors: Kuo-Tai Huang; Wen-Yi Hsieh, both of Hsinchu; Wen-Kuan Yeh, Chupei; Tri-Rung Yew, Hsinchu Hsien, all of Taiwan

[73] Assignee: United Microelectronics Corp., Hsinchu, Taiwan

[21] Appl. No.: 09/024,183

[22] Filed: Feb. 17, 1998

[30] Foreign Application Priority Data

Dec. 22, 1997 [TW] Taiwan ................................. 86119490

[51] Int. Cl.[7] .............................................. H01L 21/8242
[52] U.S. Cl. ......................... 438/253; 438/396; 438/528; 438/964
[58] Field of Search .................................. 438/396, 253, 438/528, 964

[56] References Cited

U.S. PATENT DOCUMENTS 5,429,972  7/1995  Anjum et al. .............................. 437/47
5,670,406  9/1997  Tseng ........................................ 437/52

*Primary Examiner*—John F. Niebling
*Assistant Examiner*—Jennifer M. Kennedy

[57] ABSTRACT

A method of fabricating a capacitor, comprising the steps of: providing a conductive layer over a semiconductor substrate having a transistor formed thereon to connect a source/drain region of the transistor; forming a hemispherical grained silicon layer over the conductive layer; using an implantation method to implant ions into the hemispherical grained silicon layer; performing a thermal treatment process to convert the ions into a barrier layer over the hemispherical grained silicon layer; performing a wet etching process to clean a surface of the barrier layer; forming a dielectric layer over the barrier layer and forming a top electrode over the dielectric layer.

39 Claims, 2 Drawing Sheets

METHOD OF FABRICATING CAPACITOR UTILIZING AN ION IMPLANTATION METHOD

CROSS-REFERENCE TO RELATED APPLICATION

This application claims the priority benefit of Taiwan application serial no. 86119490, filed Dec. 22, 1997, the full disclosure of which is incorporated herein by reference.

BACKGROUND OF THE INVENTION

1. Field of the Invention

The invention relates in general to the fabrication of semiconductor integrated circuits (ICs), and more particularly to a method of fabricating a capacitor.

2. Description of the Related Art

A highly integrated memory device, e.g., dynamic random access memory (DRAM) with a storage capacity of 256 MB or above, needs to use a very thin dielectric layer in order to realize a three dimensional capacitance structure, such as a stack-type capacitor or a trench-type capacitor. These memory device should has enough storage charges to avoid the soft error. The dielectric layer is usually made from tantalum oxide ($Ta_2O_5$), by a low pressure chemical vapor deposition (LPCVD) method. The dielectric constant of the tantalum oxide is larger than the dielectric constant of the oxide. The tantalum oxide has a dielectric constant of about 25 and the good step cover capability.

It is well known that the number of defects is inversely proportional to annealing temperature in the dielectric formation process, and that the quality of dielectric layer is directly proportional to the anneal temperature. However, a native oxide layer is formed at the interface between the dielectric layer and the bottom electrode in the high temperature annealing process. Hence the dielectric constant of the dielectric layer formed in subsequent processes is decreased by the formation of the native oxide layer, and the capacitance of the capacitor is decreased by the reduced dielectric constant. To the contrary, in a low temperature annealing process, the number of defects is not effectively reduced by the low temperature and the quality of the dielectric layer is decreased by this low temperature.

Conventionally, a hemispherical grained silicon (HSG) layer is formed to increase the surface area of the bottom electrode, but the surface of the HSG layer is sharp. Therefore, as the dielectric layer is formed in the subsequent process, the surface of the dielectric layer will be sharp. Therefore, the leakage current is caused by the sharp surface of the dielectric layer.

FIGS. 1A through 1D are cross-sectional views showing the progression of fabricating a capacitor structure according to a conventional method. Referring to FIG. 1A, a conductive layer 10 is provided. The conductive layer 10 serves to connect source/drain regions of transistors on a semiconductor substrate structure (not shown in the figures). Other device structures are already formed on the substrate structure. In order to simplify the figures and emphasize the characteristics of the conventional method, the substrate structure is not shown in the figures. The conductive layer 10 is formed, for example, by LPCVD method. For example, the conductive layer 10 is composed of doped polysilicon, Furthermore, the conductive layer 10 is utilized as a bottom electrode for the capacitor.

HSG layer 12 is then formed over the surface of the conductive layer 10. The HSG layer 12 is formed, for example, by using $SiH_4$ and $Si_2H_6$ as the reaction gases, and is carried out at a temperature of between the formation temperature of amorphous silicon and polysilicon. An annealing process is performed to improve the quality of the HSG layer 12. However, a thin layer of native oxide 13 is formed over the surface of the HSG layer 12 in the anneal process and the dielectric constant of the dielectric layer formed in subsequent processes is decreased by the native oxide layer 13. Therefore, the native oxide layer 13 will be removed in the subsequent processes.

Referring to FIG. 1B, the native oxide layer 13 over the surface of the HSG layer 12 is removed by the diluted hydrogen fluoride (HF) solution. Thereafter, a thin layer silicon oxynitride 14 ($SiO_xN_y$) is formed on the HSG layer 12 by a rapid thermal process (RTP). The RTP process is performed with nitrogen gas at a high temperature, so that a nitridation reaction occurs, forming the silicon oxynitride layer 14. The silicon atoms in the HSG layer 12 react with the nitrogen gas by the RTP process. The silicon oxynitride layer 14 is used as a barrier layer to prevent the formation of the native oxide in the subsequent thermal processes.

Referring to FIG. 1C, a tantalum oxide layer 16 is formed over the surface of the silicon oxynitride layer 14, for example, by a LPCVD method. The LPCVD method is performed by using $Ta(OC_2H_5)_5$ compounds and is carried out at a temperature of about 360–480° C. Thereafter, an anneal process is performed to density the tantalum oxide layer 16. The annealing process is performed with dry oxygen gases or nitrogen gases and is then raised to a temperature of about 700–950° C. The tantalum oxide layer 16 is utilized as a dielectric layer for the capacitor. The formation of the native oxide is not effectively inhibited by the silicon oxynitride layer 14 formed according to the conventional method. In this manner, a native oxide layer 18 is formed at the interface between the tantalum oxide layer 16 and the silicon oxynitride layer 14 during the anneal process. Therefore, the dielectric constant of the dielectric layer and the capacitance of the capacitor are decreased by the native oxide layer 18.

In addition, FIG. 1C shows that the surfaces of the HSG layer 12 and the tantalum oxide layer are sharp, as shown in regions 19. This causes leakage current to form in the regions 19.

Referring to FIG. 1D, a layer of top electrode composed of titanium nitride (TiN) is formed over the surface of the tantalum oxide 16, for example, by a sputtering method.

Subsequently, conventional processes for the complete formation of the capacitor are performed. Because the conventional processes are familiar to those skilled in the art, detailed descriptions are omitted here.

The formation of the native oxide layer 18 is not inhibited by the silicon oxynitride layer 14 in the conventional processes. Therefore, the dielectric constant of the dielectric layer and the capacitance of the capacitor are reduced by this native oxide layer 18. The annealing temperature is limited by the formation of the native oxide layer 18. Hence the quality of the dielectric layer is decreased. Furthermore, leakage current effect of the capacitor is caused by the sharp surface of the dielectric layer.

SUMMARY OF THE INVENTION

It is therefore an object of the invention to provide a method of fabricating a capacitor to prevent the formation of native oxide and leakage current of the capacitor, to improve quality of the dielectric layer and to increase the annealing temperature.

To achieve this and other advantages and in accordance with the purpose of the invention, as embodied and broadly described herein, the invention includes a method of fabricating a capacitor. The method includes the following steps: providing a conductive layer over a semiconductor substrate having a transistor formed thereon to connect a source/drain region of the transistor; forming a hemispherical grained silicon layer over the conductive layer. Thereafter, using an implantation method to implant ions into the hemispherical grained silicon layer; performing a thermal treatment process to convert the ions into a barrier layer over the hemispherical grained silicon layer; performing a wet etching process to clean a surface of the barrier layer; forming a dielectric layer over the barrier layer and forming a top electrode over the dielectric layer.

A first characteristic of this invention is that the ions are implanted into the HSG layer and a RTP process is performed forming the barrier layer over the surface of the HSG layer. The formation of native oxide is prevented by the barrier layer during the formation step of the dielectric layer.

A second characteristic of this invention is that the formation of native oxide is prevented by the barrier layer during the annealing process to form the dielectric layer. Therefore, the annealing temperature can be raised and the quality of the dielectric layer improved.

A third characteristic of this invention is that the HSG layer having a smooth surface can be made, and the sharp surface of the dielectric layer formed in the subsequently processes is prevented. Therefore, the formation of leakage current in the capacitor is prevented, and the quality of the dielectric layer is improved.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
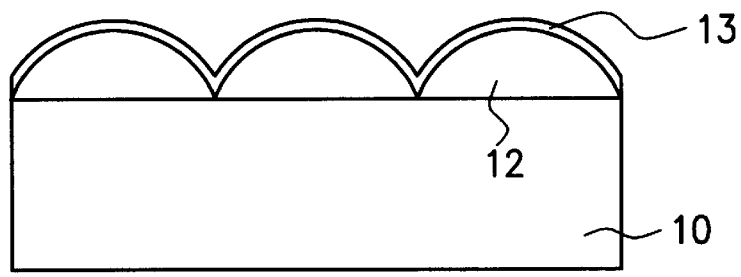
FIGS. 1A through 1D are cross-sectional views showing the progression of fabricating a capacitor structure according to a conventional method.
Figure 1B:
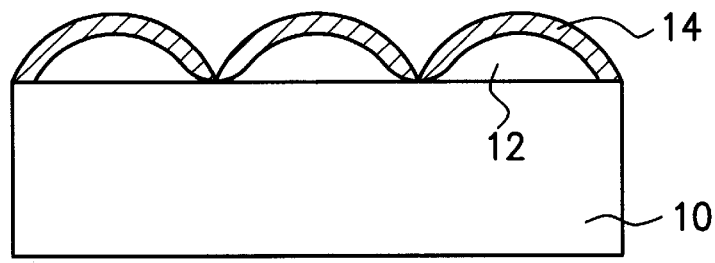
Figure 1C:
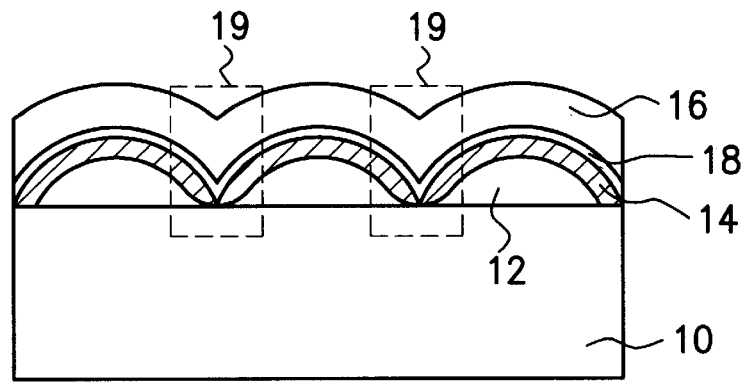
Figure 1D:
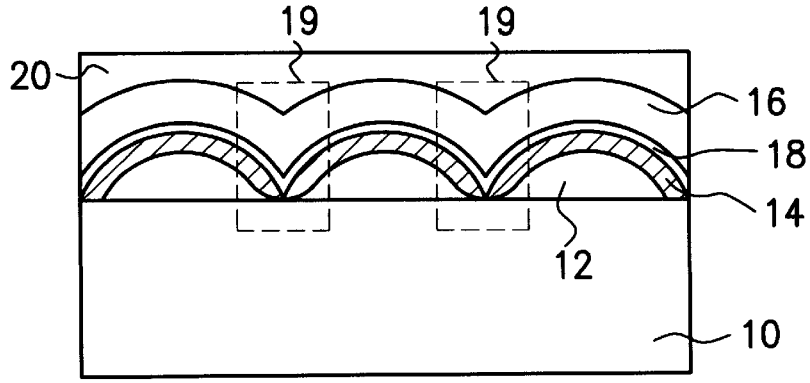
Figure 2A:
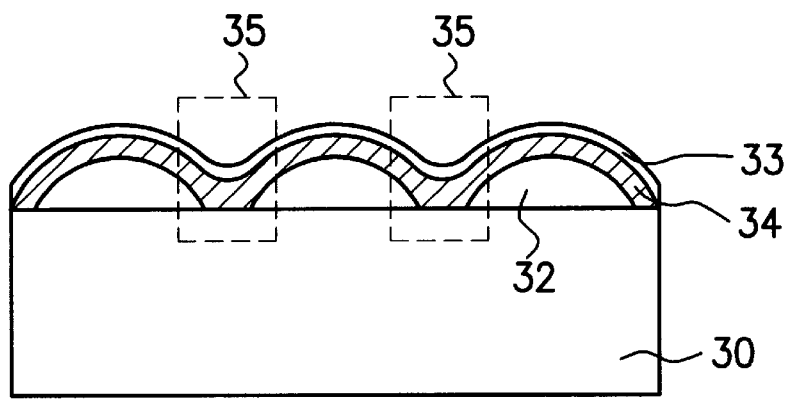
FIGS. 2A to 2C are cross-sectional views showing the process steps of a method of fabricating a capacitor according to one preferred embodiment of this invention.
Figure 2B:
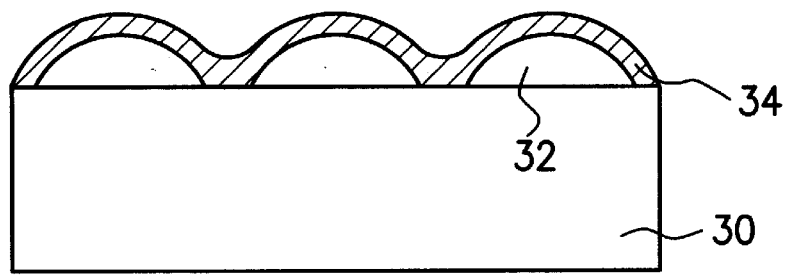
Figure 2C:
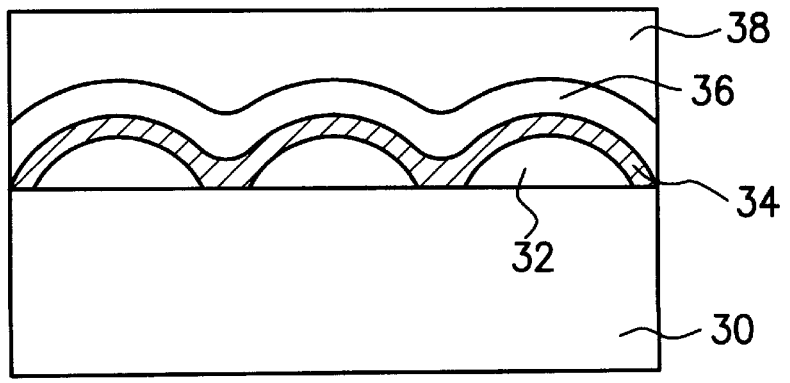

FIGS. 2A to 2C are cross-sectional views showing the process steps of a method of fabricating a capacitor according to one preferred embodiment of this invention.

Referring first to FIG. 2A, a conductive layer 30 is provided; the conductive layer 30 serves to connect source/drain regions of a transistor on a semiconductor substrate structure (not shown in the figures). Other device structures are already formed on the substrate structure. In order to simplify the figures and emphasize the characteristics of the present invention method, the substrate structure is not shown in the figures. The conductive layer 30, for example, doped polysilicon, can be formed, for example, by LPCVD method. Furthermore, the conductive layer is utilized as the bottom electrode for the capacitor.

Thereafter, a HSG layer 32 is formed over the surface of the conductive layer 30. The HSG layer 32 is formed, for example, by using $SiH_4$ and $Si_2H_6$ as the reaction gases and is carried out at a temperature between the formation temperatures of amorphous silicon and polysilicon. A annealing process is performed to improve the quality of the HSG layer 32.

Nitrogen ions are then implanted into the HSG layer 32 by using an implantation method. The voltage condition of the implantation method is about 10–30 KeV, and the concentration of the ions is in the range of $5 \times 10^{14}$–$5 \times 10^{15}/cm^2$. Thereafter, a thin barrier layer 34, such as a silicon oxynitride or silicon nitride layer, is formed on the HSG layer 32 by a rapid thermal process (RTP). The RTP process is performed with nitrogen dioxide ($N_2O$) or oxygen gases at high temperature, and a nitridation reaction is carried out to form the barrier layer 34, wherein the silicon atoms in the HSG layer 32 react with the ambient gases during this RTP process. The barrier layer 34 is utilized to inhibit the interaction between ambient oxygen atoms and silicon atoms in the HSG layer 32. The barrier layer 34 is formed by directly implanting nitrogen ions into the HSG layer 32, hence the molarity of the nitrogen atoms can be much larger than the molarity of the oxygen atoms in the molecular formula of the barrier layer 34.

The number of defects in the HSG layer 32 is decreased by the RTP process, thereby improving the quality of the HSG layer 32. The region 35 is smoothed by the method of the present invention, thus preventing the occurrence of leakage current in the dielectric layer formed in the subsequent processes. However, a thin layer of native oxide 33 is formed over the surface of the HSG layer 32 in the RTP process. This native oxide layer 33 would reduce the dielectric constant of the dielectric layer formed in subsequent processes. The native oxide layer 33 will be removed in the subsequent processes to prevent this reduction.

Referring to FIG. 2B, the barrier layer 34 is cleaned by a wet etching method, for example, by using diluted hydrogen fluoride solution. The native oxide layer 33 over the surface of the barrier layer 33 is removed during the wet etching process.

Then, for example, another RTP process is performed with nitrogen ($N_2$) gases at high temperature to perform a nitridation reaction to increase the molarity of the nitrogen atoms. This RTP process is performed to enhance the barrier effect of the barrier layer 34. It is important to note that according to the method of the present invention, after the native oxide layer 33 is formed, the RTP process could be performed or omitted.

Referring to FIG. 2C, for example, a dielectric layer 36 composed of tantalum oxide is deposited by LPCVD method over the surface of the barrier layer 34. The LPCVD method is performed by using $[Ta(OC_2H_5)_5]$ compound and is carried out at a temperature of about 360–480° C. Thereafter, an annealing process is performed to densify the dielectric layer 36. The annealing process is performed with dry oxygen gases or nitrogen gases and is carried out at a temperature of about 700–950° C. According to the method of fabricating a capacitor in the present invention, the native oxide is effectively inhibited by the barrier layer 34. Therefore, the anneal temperature is increased (higher than 850° C.), the quality of the dielectric layer 36 is increased and the formation of the native oxide is inhibited.

Finally, a layer of top electrode 38 composed of titanium nitride is formed over the surface of the dielectric layer 36, for example, by a sputtering method. Subsequently, conventional processes for the complete formation of the capacitor are performed. Because the conventional processes are familiar to those skilled in the art, detailed descriptions are omitted here.

While the invention has been described by way of example and in terms of a preferred embodiment, it is to be understood that the invention is not limited thereto. Here is another preferred embodiment according to the invention. The HSG layer 32 is not formed in this preferred embodiment. After the conductive layer is deposited, the formation step of the HSG layer 32 is not performed. Instead ions are implanted directly into the conductive layer 30. A barrier layer is formed over the surface of the conductive layer 30. The barrier layer is composed of silicon oxynitride or silicon nitride. Subsequently, the same processes, as shown in FIG. 2B–FIG. 2C, for the complete formation of the capacitor are performed.

A first characteristic of this invention is that the ions are implanted into the HSG layer 32 and the RTP process is performed, forming the barrier layer 34 over the surface of the HSG layer 32. The formation of native oxide is prevented by the barrier layer 34 during the formation step of the dielectric layer 36.

A second characteristic of this invention is that the formation of native oxide is prevented by the barrier layer 34 during the annealing process. And, the annealing temperature can be raised, improving the quality of the dielectric layer 36.

A third characteristic of this invention is that the HSG layer 32 having the smooth surface can be made, avoiding a the sharp surface on the dielectric layer 36 formed in the subsequent processes. Therefore, the formation of leakage current in the capacitor is prevented, and the quality of the dielectric layer 36 is improved.

While the invention has been described by way of example and in terms of a preferred embodiment, it is to be understood that the invention is not limited thereto. To the contrary, it is intended to cover various modifications and similar arrangements and procedures, and the scope of the appended claims should therefore be accorded the broadest interpretation so as to encompass all such modifications and similar arrangements and procedures.

What is claimed is:

1. A method of fabricating a capacitor, comprising the steps of:

forming a conductive layer over a semiconductor substrate having a transitor formed thereon to connect a source/drain region of the transistor;

forming a hemispherical grained silicon layer on the conductive layer;

implanting ions into a surface region of the hemispherical grained silicon layer by using an implantation method;

performing a thermal treatment process to convert the ions into a barrier layer on the hemispherical grained silicon layer;

performing a wet etching process to clean a surface of the barrier layer but without removing the barrier layer;

forming a dielectric layer on the barrier layer; and forming a top electrode on the dielectric layer.

2. A method according to claim 1, wherein further includes performing a rapid thermal process between the steps of performing the wet etching and forming the dielectric layer.

3. A method according to claim 2, wherein the step of performing the rapid thermal process comprises using nitrogen gases.

4. A method according to claim 1, wherein the method for forming the conductive layer comprises using a low pressure chemical vapor deposition method.

5. A method according to claim 1, wherein the step for forming the hemispherical grained silicon layer comprises using a low pressure chemical vapor deposition method, and the hemispherical grained silicon layer substantially covers entire upper surface of the conductive layer.

6. A method according to claim 1, wherein the implantation method has a energy of about 10–30 KeV.

7. A method according to claim 1, wherein of the ions have a concentration of about $5 \times 10^{14}$–$5 \times 10^{15}$/cm$^2$.

8. A method according to claim 1, wherein the ions comprise nitrogen ions.

9. A method according to claim 1, wherein the step of performing the thermal treatment process comprises performing a rapid thermal process.

10. A method according to claim 9, wherein the step of performing the rapid thermal process comprises using nitrogen dioxide gases.

11. A method according to claim 9, wherein the step of performing the rapid thermal process comprises using oxygen gases.

12. A method according to claim 1, wherein the step of performing the wet etching process comprises using a diluted hydrogen fluoride solution.

13. A method according to claim 1, wherein the method for forming the dielectric layer comprises using a low pressure chemical vapor deposition method.

14. A method according to claim 1, wherein the step of forming the dielectric layer comprises using a temperature of about 700–950° C.

15. A method according to claim 1, wherein the step of forming the top electrode comprises using a sputtering method.

16. A method according to claim 1, wherein the dielectric layer comprises tantalum oxide.

17. A method according to claim 1, wherein the top electrode comprises titanium nitride.

18. A method according to claim 1, wherein the conductive layer comprises doped polysilicon.

19. A method according to claim 1, wherein the barrier layer comprises silicon oxynitride.

20. A method according to claim 1, wherein the barrier layer comprises silicon nitride.

21. A method of fabricating a capacitor, comprising the steps of:

forming a conductive layer over a semiconductor substrate having a transitor formed thereon to connect a source/drain region of the transistor;

implanting ions into a surface region of the conductive layer by using an implantation method;

performing a thermal treatment process to convert the ions into a barrier layer on the conductive layer;

performing a wet etching process to clean a surface of the barrier layer without removing the barrier layer;

forming a dielectric layer on the barrier layer; and forming a top electrode on the dielectric layer.

22. A method according to claim 21, wherein further includes performing a rapid thermal process between the steps of performing the wet etching and forming the dielectric layer.

23. A method according to claim 22, wherein the step of performing the rapid thermal process comprises using nitrogen gases.

24. A method according to claim 21, wherein the method for forming the conductive layer comprises using a low pressure chemical vapor deposition method.

25. A method according to claim 21, wherein the implantation method has a energy of about 10–30 KeV.

26. A method according to claim 21, wherein the ions have a concentration of about $5\times10^{14}$–$5\times10^{15}/cm^2$.

27. A method according to claim 21, wherein the ions comprise nitrogen ions.

28. A method according to claim 21, wherein the step of performing the thermal treatment process comprises performing a rapid thermal process.

29. A method according to claim 28, wherein the step of performing the rapid thermal process comprises using nitrogen dioxide gases.

30. A method according to claim 28, wherein the step of performing the rapid thermal process comprises passing oxygen gases.

31. A method according to claim 21, wherein the step of performing the wet etching process comprises using a diluted hydrogen fluoride solution.

32. A method according to claim 21, wherein the method for forming the dielectric layer comprises using a low pressure chemical vapor deposition method.

33. A method according to claim 21, wherein the step of forming the dielectric layer comprises using a temperature of about 700–950° C.

34. A method according to claim 21, wherein the step of forming the top electrode comprises using a sputtering method.

35. A method according to claim 21, wherein the dielectric layer comprises tantalum oxide.

36. A method according to claim 21, wherein the top electrode comprises titanium nitride.

37. A method according to claim 21, wherein the conductive layer comprises doped polysilicon.

38. A method according to claim 21, wherein the barrier layer comprises silicon oxynitride.

39. A method according to claim 21, wherein the barrier layer comprises silicon nitride.

* * * * *